United States Patent
DiGiacomo

[19]

[11] Patent Number: 5,950,907
[45] Date of Patent: Sep. 14, 1999

[54] TERNARY SOLDER FOR THE ENHANCEMENT OF C-4 FATIGUE LIFE

[75] Inventor: Giulio DiGiacomo, Hopewell Junction, N.Y.

[73] Assignee: International Business Machines Corporation, Armonk, N.Y.

[21] Appl. No.: 08/825,036

[22] Filed: Mar. 26, 1997

Related U.S. Application Data

[62] Division of application No. 08/687,272, Jul. 25, 1996, Pat. No. 5,861,336.

[51] Int. Cl.[6] .................................................. H05K 3/34
[52] U.S. Cl. ..................................... 228/180.22; 228/254
[58] Field of Search ...................... 228/180.22, 180.21, 228/123.1, 253, 254, 1

[56] References Cited

U.S. PATENT DOCUMENTS

| | | | |
|---|---|---|---|
| 5,060,844 | 10/1991 | Behun et al. | 228/180.22 |
| 5,520,752 | 5/1996 | Lucey, Jr. et al. | 148/400 |
| 5,525,548 | 6/1996 | Nishiguchi | 437/215 |

OTHER PUBLICATIONS

Metals Handbook Ninth Edition, vol. 6, pp. 1091–1096, 1983.

Microelectronics Packaging Handbook, Van Nostrand Reinhold, New York, Editor by: Rao R. Tummala and Eugene J. Tymaszewski; 1989, cover pages and pp. 361–391, 1989.

SLT Device Metallurgy and Its Monolithic Extension, IBM J. Res. Develop., by P.A. Tota nad R.P. Sopher, vol. 3, May 1969, pp. 226–238, 1969.

*Primary Examiner*—Samuel M. Heinrich
*Attorney, Agent, or Firm*—DeLio & Peterson, LLC; John J. Tomaszewski; Aziz M. Ashan

[57] ABSTRACT

An enhanced fatigue life solder comprising, by weight, about 1–3% tin, about 1–3% silver and the balance essentially lead is provided. The solder is particularly useful for joining electronic components and in particular for making C-4 interconnections. A method for using the solder to make electronic components and electric components made using the method are also provided.

5 Claims, 3 Drawing Sheets

TERNARY SOLDER FOR THE ENHANCEMENT OF C-4 FATIGUE LIFE

This is a divisional of application Ser. No. 08/687,272 filed on Jul. 25, 1996, now U.S. Pat. No. 5,831,336.

BACKGROUND OF THE INVENTION

1. Field of the Invention

This invention relates to solder having enhanced fatigue life properties and, more particularly, to the use of the solder to make C-4 connections in electronic components. The solder also exhibits a low standard deviation (sigma) with regard to the connection failure distribution thus delaying the use time for earliest failure of a solder joint.

2. Description of Related Art

The use of solder to join materials such as components of an electronic structure is well known in the art. In the electronics area, there are a myriad of structures which require connection to other similar structures or to other levels of packaging. Examples include mounting of integrated circuit chips to a metallized substrate; mounting a card on which several chips could be mounted to a board which provides interconnection circuitry, etc. For the sake of clarity and consistency in describing the present invention the specification will be directed to electronic components made using Controlled Collapse Chip Connection (C-4) technology.

C-4 technology is an interconnection technology developed by IBM as an alternative to wire bonding. Broadly stated, one or more integrated circuit chips are mounted above a single or multilayer substrate and pads on the chip are electrically connected to corresponding pads on the substrate by a plurality of electrical connections known as solder bumps. An example of an area array C-4 configuration is a square grid array which is 11 C-4 pads long by 11 pads wide on 10 mil centers. A five mil solder bump is located at every intersection in the grid except one which is typically displaced for orientation purposes. A popular chip is a circuit "computer-on-a-chip" which has 762 C-4 solder bumps in a 29×29 area array.

The C-4 technology has also extended to other applications and is now used on thin-film resistor and composite chips in hybrid modular applications. Solder pads for this application are very large-about 25 mil in diameter. At the other extreme, C-4s have been used for precision registration and alignment in the joining of a GaAs wave guide. The most dense area array reported has been a 128×128 array of 1 mil bumps on about 2 mil centers resulting in 16,000 pads.

The C-4 technology utilizes solder bumps deposited on wetable metal terminals on the chip and a matching foot print of solder wetable terminals on the substrate. The upside-down chip (flip chip) is aligned to the substrate, and all joints are made simultaneously by reflowing the solder bumps. The flow on the chip is limited by a ball limiting metallurgy (BLM) pad which is generally a circular pad of evaporated, thin-film metal such as chromium, copper and gold that provides the sealing of the via as well as the solderable, conductive base for the solder bump. A very thick deposit of evaporated solder acts as the primary conduction and joining material between chip and substrate.

Melting point has been a consideration in the choice of solder alloys for C-4s. Lead solders, especially 95 Pb/5 Sn have been widely used with alumina ceramic substrates because of their high melting point of approximately 315° C. Their use for the chip connection allows other lower-melting point solders to be used at the module-to-card or card-to-board packaging level without remelting the chip's C-4s. Intermediate melting point solders such as eutectic 63 Sn/37 Pb (melting point 183° C.) and a 50 Pb/50 In melting point of approximately 220° C. have been used. In "Microelectronics Packaging Handbook", edited by R. R. Tummala and Rymaszewski, 1989, van Nostrand Reinhold, pages 361–391, C-4 chip to package interconnections as well as typical solders used in C-4 technology are discussed and this reference is hereby incorporated by reference.

While there are a number of technologies that can be used to form the pads and the solder bumps, metal mask technology is most widely used at the present time. BLM and solder are evaporated through holes in a metal mask and deposited as an array of pads onto the wafer surface. A typical multilayer structure of the BLM can be described by using Cr—Cu—Au and an example. A typical evaporator would have numerous metal charges with thermal energy supplied by resistance, induction or electron beams. Cr is evaporated first for adhesion to the passivation layer as well as to form a solder reaction barrier to the aluminum. A phased layer of Cr and Cu are coevaporated next to provide resistance to multiple reflows. This is followed by a pure Cu layer to form the soluble metallurgy. A flash of gold is then provided as an oxidation protection layer. While lead and tin are usually in the same charge (single molten pool) the higher vapor pressure component, Pb, deposits first, followed by tin on top of the lead. Reflow in a $H_2$ ambient furnace at about 350° C. melts and homogenizes the pad and brings the solder bump to its spherical shape. Photolithographic processes and combinations of photolith and metal mask are becoming more and more popular for fabricating terminals.

Once the BLM, TSM (top surface metallurgy of the substrate to be joined) and solder are in place, the joining of chips to the substrate using C-4 technology is relatively straight forward. Flux, either water-white rosin for high-lead solders with water-soluble flux for low lead and other low-melting solders, is normally placed on the substrate as a temporary adhesive to hold the chips in place. Such an assembly is then subjected to a reflow thermal cycle wherein the pads on the chip and the substrate self-align due to the high-surface-tension forces of the solder to complete the assembly. Once the chip-joining operation is complete, cleaning of flux residues is accomplished with such solvents as chlorinated solvents or xylene. The assembly is then electrically tested.

As mentioned above, new technologies are continuously increasing the number of C-4 interconnections per device, and/or the size of the chip, both of which affect the stresses on the solder interconnections. As chips become more and more dense, higher input/output counts will drive area arrays of terminals to as many as 155,000 pads on a 20 mm chip. This will result as the number of pads increase while the pad sizes and spacings decrease. The new technologies will induce large strains to the solder joint and new solders are needed to meet the fatigue requirements of these types interconnections.

Bearing in mind the problems and deficiencies of the prior art, it is therefore an object of the present invention to provide a solder having enhanced fatigue life properties.

It is another object of the present invention to provide a method for making solder interconnections, especially C-4 interconnections, using the specially defined solder of the invention.

A further object of the invention is to provide electronic structures, especially C-4 containing structures, made using the method of the invention.

Still other objects and advantages of the invention will in part be obvious and will in part be apparent from the specification.

SUMMARY OF THE INVENTION

The above and other objects, that will be apparent to those skilled in the art, are achieved by the present invention which relates to an enhanced fatigue resistant solder useful for joining electronic components comprising, by weight, about 1–3% tin, preferably about 1–2% tin, about 1–3% silver, preferably about 1–2% silver and the balance essentially lead. Preferably, the solder contains tin in the amount of about 1.25%–1.75%, and more preferably about 1.4%–1.6%, e.g., 1.5% and silver in an amount of about 1.25%–1.75% and more preferably about 1.4%–1.6%, e.g., 1.5%.

In another aspect of the present invention, a method is provided for making solder electrical interconnections, especially C-4 interconnections, in an electronic component comprising the steps of:

applying the solder to one surface of a first substrate of the electronic component, the solder comprising, by weight, about 1–3% tin, preferably about 1–2% tin, about 1–3% silver, preferably about 1–2% silver and the balance essential lead;

bringing the surface of a second substrate of the electronic component to be joined to the first substrate into contact with the solder; and heating the contacted substrates to a temperature sufficient to form the solder interconnections between the substrates.

In a further aspect of the invention, the electronic components to be joined are a multilayer ceramic substrate and a semiconductor chip.

In a further aspect of the invention, electronic components made by the above methods are also provided.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 2:
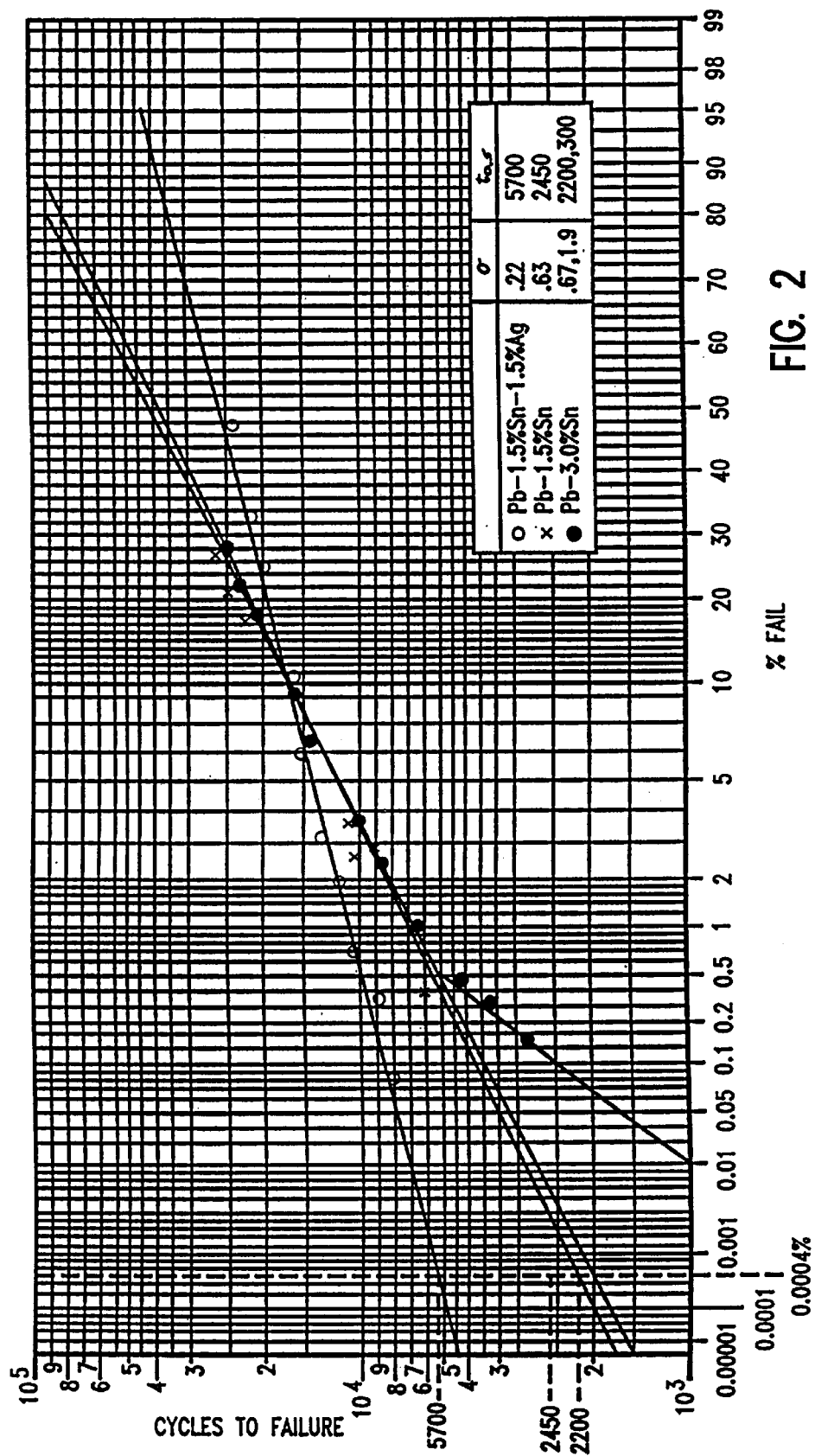
FIG. 2 is a log-normal graph showing the relationship between the cycles to failure and the cumulative percent fail on a C-4 basis for C-4 joints in a 17 by 17 footprint chip for the alloy of the invention and alloys of the prior art.
Figure 3:
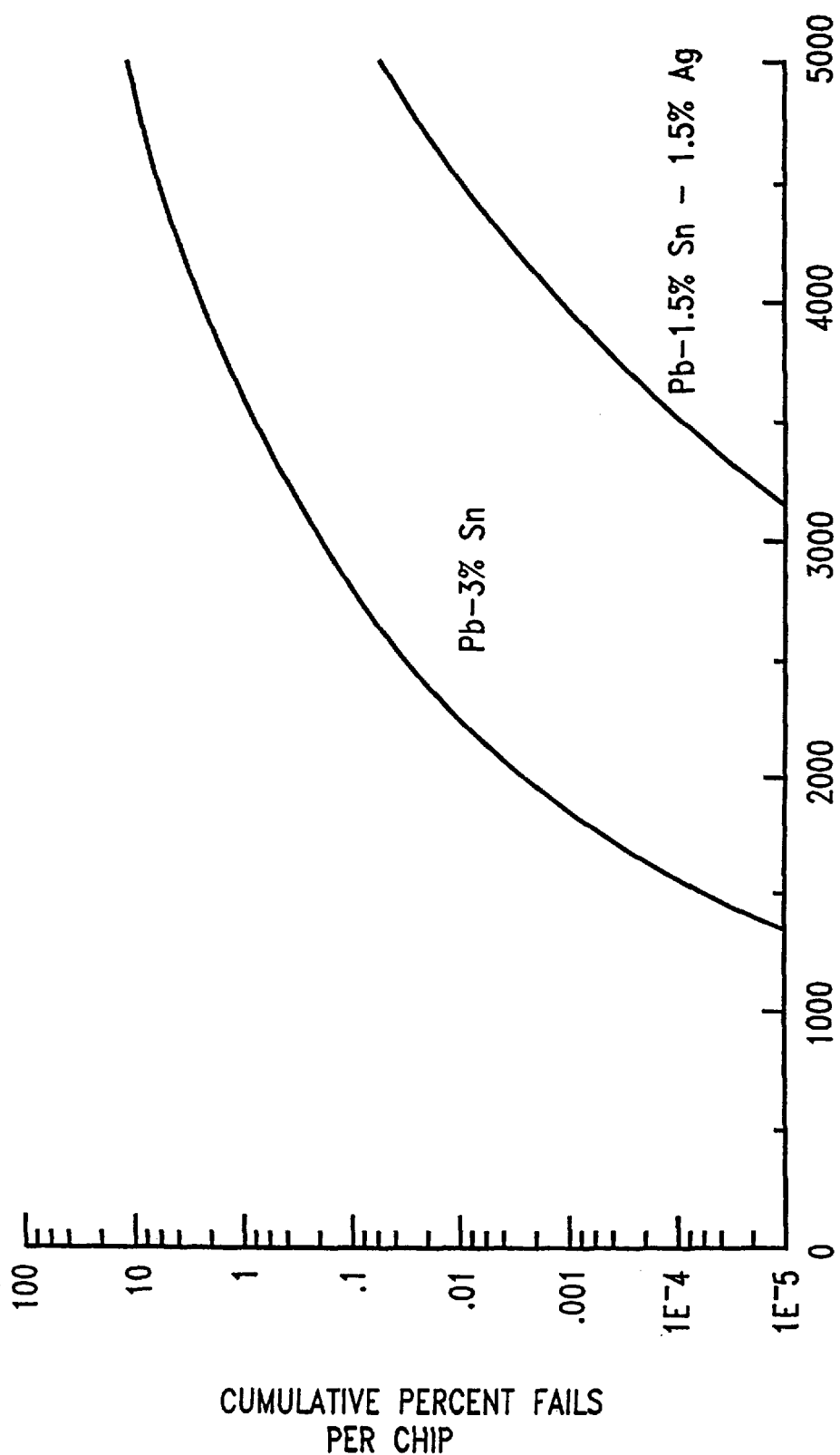
FIG. 3 is a log-linear graph showing the relationship between the cumulative percent fails per chip and field cycles for the alloy of the invention and an alloy of the prior art.

In describing the preferred embodiment of the present invention, reference will be made herein to FIGS. 1–3 of the drawings in which like numerals refer to like features of the invention. Features of the invention are not necessarily shown to scale in the drawings.

The solder of the invention comprises, by weight, about 1–3% silver, preferably about 1–2% silver, about 1–3% tin, preferably about 1–2% tin and the balance essentially lead including the usual impurities. Pure lead is preferably used. It is most preferred to use alloys comprising about 1.25%–1.75% silver and about 1.25%–1.75% tin and the balance essentially lead with a highly preferred solder comprising about 1.4%–1.6% silver, about 1.4%–1.6% tin and the balance essentially lead. A specific alloy which is preferred because of its demonstrated effectiveness is a solder containing about 1.5% tin, about 1.5% silver and the balance lead.

The alloy of the invention may be formed by melting the components together and cooling the mixture to form the solder in solid form. In the solid form, the alloy has a homogeneous structure containing finely divided $Ag_3Sn$ precipitates distributed throughout the matrix as determined by electron diffraction analysis. The precipitates are generally in the shape of platelets with dimensions of the order of 100 nm in thickness and 250 nm in diameter as determined by electron microscopy. The silver is found to be totally consumed or reacted in forming the $Ag_3Sn$ phase, and the silver reaction and homogeneous distribution of the $Ag_3Sn$ precipitate phase is considered to occur relatively fast so that on solidification no free silver remains in the solidified solder. The remainder of the tin remains in solution with the lead.

When the alloy is in the molten state each of the silver, tin and lead is present in its elemental form. The alloy of the invention is typically applied to the pad of the electronic component to be joined from the molten state by commonly used evaporation techniques. The evaporation is typically accomplished through a molybdenum mask from a single metal charge of the alloy but the three metals can also be plated onto the pad surface. After evaporation, the three metals are found to be stratified forming a lead layer on the pad surface, an intermediate tin layer and an overlying silver layer. These layers form due to the relative vapor pressures of the elements. When the solder is reflowed at an elevated temperature such as 350° C. the ternary alloy is formed with a homogenous structure containing finely divided $Ag_3Sn$ precipitates and the solder forms a hemispherical shape. Some intermetallic components may be formed as a result of the reflow process with the elements reacting with the metallization on the pad surface. The intermetallic components adhere to the metallized surface but traces of the intermetallic may dissolve in the solder matrix. For example, if copper and gold are in the pad metallization a copper tin and/or gold tin intermetallic component may form. Also, other metallic elements such as nickel may also form a nickel-tin intermetallic and be present in the solder phase. These intermetallic components have not been found to have any significant effect on the properties, e.g., fatigue of the solder joint. It will be appreciated however, that due to the reflow and joining operation that the originally evaporated ternary alloy usually becomes a more complex alloy depending on the elements present on the metallized pads.

It has been found that using the solder of the invention provides soldered joints such as C-4 joints to have an extended fatigue life compared to solder joints made with solder of the prior art. The fatigue enhancement in terms of fatigue life at the tolerance fail level is generally more than two to three times the prior art alloys which are commonly used to make solder joints. Another considerable benefit which is provided by using the solder of the invention is the low sigma value (standard deviation of the fail times). This means that a first C-4 fail instead of occurring, say, after 2000 cycles will occur beyond 6000 cycles with it being appreciated that one C-4 failure is all that is typically needed to exceed technology tolerance limits. Therefore, the tightness (low value) of the sigma limit is an extremely important factor in minimizing failures of electronic components. It is hypothesized that the $Ag_3Sn$ precipitates serve as nucleating sites during solder solidification controlling the grain size structure of the solder and act as obstacles to crack propagation which is rate-controlling in the fail mechanism. The $Ag_3Sn$ precipitates considerably slow down crack propagation in the solder joint resulting in also a tight sigma limit.

Another benefit of the solder of the invention is that none of the other required properties of the solder are negatively effected such as corrosion, metal migration, electromigration, etc. The fine precipitates coupled with more grain boundaries make propagation of a fault much more difficult such that their fatigue fails will converge within a tight distribution with a minimum scatter. The concentration of the precipitates in the C-4 solder bump is estimated at about 2% by weight on the basis of a fully reactive silver and tin components.

The solder of the invention and a lead-3% tin control solder of the prior art were also tested for metal migration under water by biasing chip C-4s under various voltages. In both solders, the metal that migrated was lead. This test by water-drop for water-immersing is generally used in the electronic industry to determine which metal would be susceptible or have the propensity to migrate under the worst possible conditions. The results indicate that if any metal migration would even occur due to extreme conditions of water condensation into defects or process residues would only be lead migration. These results confirm that metal migration of alloy elements, i.e., silver and tin is not expected or possible in the compound form or in solid solution with the matrix or in small amounts as fine discrete phases. The electron microprobe analysis of the dendrites showed no trace of either silver or tin. In any case, metal migration test and T/H (temperature/humidity) under electric bias were conducted with TCM's (Thermal Conduction Module) under conditions of 85° C./80% RH (relative humidity) and applied potential of 5 volts. The results of ternary and control are comparable with the ternary having a slight advantage in the low percentile which in the region of interest.

Another benefit of the invention is that the extended fatigue life of the solder joints is attained both with and without the need for module hermeticity and/or with and without an epoxy underfill. Sealing of the module and/or the use of epoxy underfill is generally used to extend the life of the component and the use of the ternary solder with its enhanced fatigue life and low sigma properties obviates the need for such techniques to increase the life of the electronic component. Of course, if such techniques are employed using the solder of the invention even more enhanced component life properties would be achieved.

EXAMPLES

The solder of the invention was evaluated with prior art lead solders containing 1% tin, 3% tin and 0.5% tin and a lead solder containing 0.2% tin and 2% bismuth. The solder was tested on a chip having a DNP (distance to neutral point) of about 6 mm.

Figure 1:
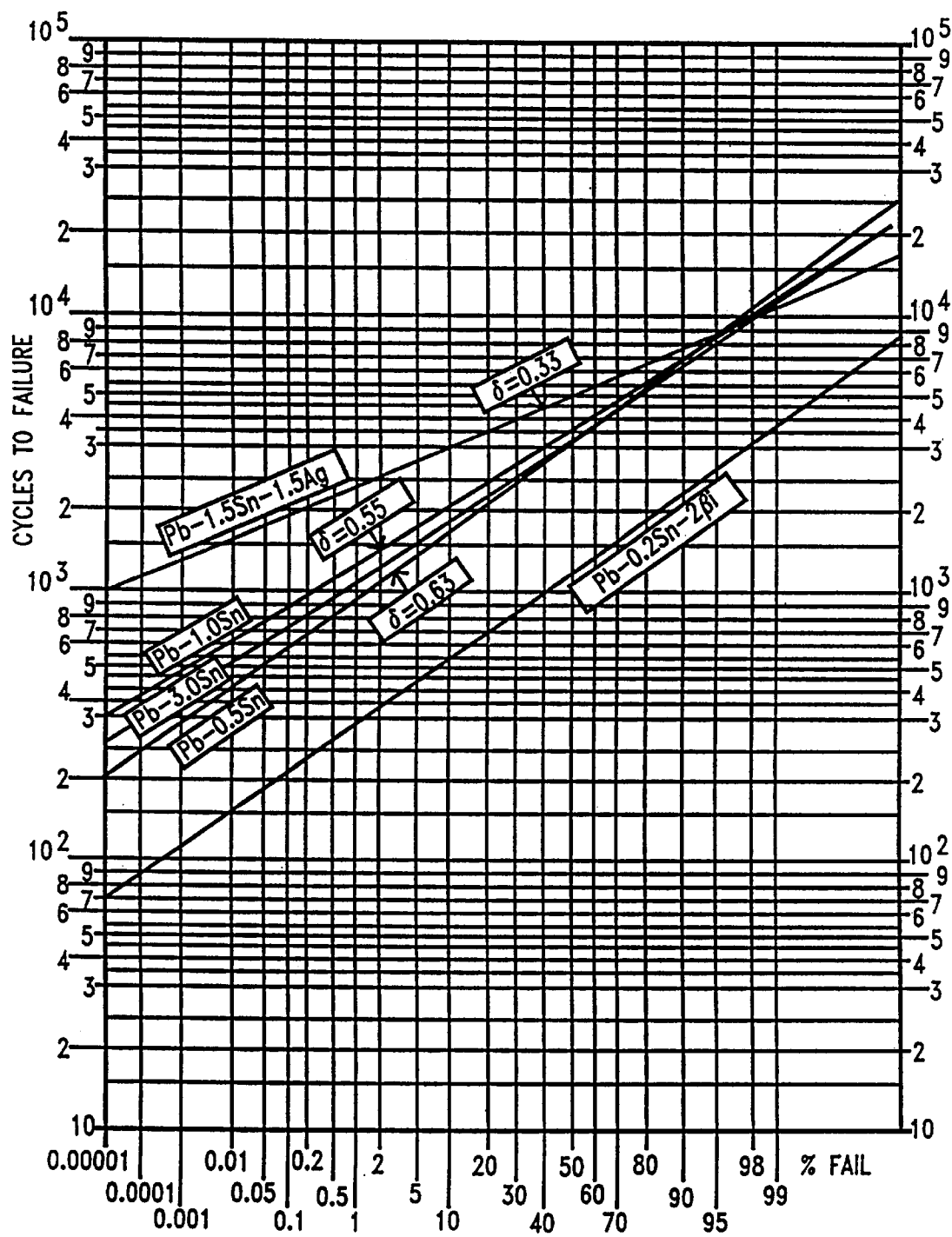
FIG. 1 is a log-normal graph showing the relationship between cycles to failure and the cumulative percent failure on a C-4 basis for the alloy of the invention vs. alloys of the prior art.

The results of the evaluation are shown in FIG. 1 where is clearly shown that the alloy of the invention has a significantly higher number of cycles-to-failure as compared to the prior art alloys. Also, it is shown that the sigma limit for the solder of the invention is must less than the other solders indicating a more useful solder.

Tests other than fatigue tests such as wetability tests, corrosion tests and metal migration show commercially satisfactory results for the solder of the invention as compared to the prior art solders. Similar fatigue tests as for the above example were conducted on chips having a DNP from 60 to greater than 100 mil. A 4 point probe was used for C-4 resistance measurement together with a fail criterion of 30 mohms. The resistance measured is that of the C-4 only, excluding contact resistance or parts of the circuitry. The test was terminated at 30,000 cycles when about 40% of all solder bumps monitored (highest DNP's) had failed. About 100 chips and about 6000 C-4's per alloy were tested with the electric resistive measurements being repeated every 1,500 cycles. The results shown in FIG. 2 again establish the clear superiority of the solder of the invention with regard to the number of cycles-to-failure and the low sigma limit.

The solder of the invention was evaluated with the prior art 3% tin lead solder with respect to fatigue. 33 chips of each alloy were joined to each of the substrates after storing the chips in nitrogen for 1000 hours. The substrates were cycled from 0 to 100° C., 48 cycles per day, for 30,000 cycles. Four point resistance measurements were made at intervals of 1,500 cycles. The results are shown in FIG. 3 and show that the ternary solder has a fatigue life of more than double that of the lead-3% tin alloy. The sigma limit is also about half that of the binary control. Corrosion tests in 85° C./81% RH for 5,000 hours showed that the ternary is at least as resistant to corrosion as the lead-3% tin solder.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making solder bump electrical interconnections between pads on a first substrate and corresponding pads on a second substrate comprising the steps of:

applying the solder to pads on the first substrate, the solder comprising, by weight, about 1–3% tin, about 1–3% silver and the balance essentially lead;

aligning the pads of the second substrate to be joined to the corresponding pads and solder bumps of the first substrate;

heating the aligned first and second substrate to a temperature sufficient to form a solder interconnection between the pads of the first and second substrates and wherein the solder interconnection contains $Ag_3Sn$ precipitate distributed throughout the solder.

2. The method of claim 1 wherein the first substrate is a semiconductor chip and the second substrate is a multilayer ceramic.

3. The method of claim 2 wherein the tin is about 1–2% and the silver is about 1–2%.

4. The method of claim 3 wherein the solder comprises about 1.25%–1.75% tin and about 1.25%–1.75% silver.

5. The method of claim 3 wherein the solder comprises about 1.4%–1.6% tin and about 1.4%–1.6% silver.

* * * * *